United States Patent [19]
Enari et al.

[11] Patent Number: 5,805,302
[45] Date of Patent: Sep. 8, 1998

[54] VARIABLE LENGTH ENCODING OF IMAGE DATA

[75] Inventors: Masahiko Enari, Yokohama; Akihiro Shikakura, Kawasaki, both of Japan

[73] Assignee: Canon Kabushiki Kaisha, Tokyo, Japan

[21] Appl. No.: 813,642

[22] Filed: Dec. 27, 1991

[30] Foreign Application Priority Data

Dec. 28, 1990 [JP] Japan .................................. 2-408931
Jan. 29, 1991 [JP] Japan .................................. 3-009148

[51] Int. Cl.$^6$ ................................................ H04N 1/41
[52] U.S. Cl. ...................... 358/433; 358/261.3; 358/432; 382/246; 382/250; 341/67; 348/420
[58] Field of Search ................................ 395/100, 114; 371/37.1, 37.2, 37.4, 37.7; 382/232, 246, 250; 341/67; 358/426, 427, 433, 467; 348/384, 390, 420, 461, 465, 466, 473

[56] References Cited

U.S. PATENT DOCUMENTS

| | | | |
|---|---|---|---|
| 4,124,871 | 11/1978 | Morrin, II | 358/287 |
| 4,334,246 | 6/1982 | Saran | 358/261 |
| 4,734,767 | 3/1988 | Kaneko et al. | 358/133 |
| 4,920,426 | 4/1990 | Hatori et al. | 358/433 |
| 4,974,078 | 11/1990 | Tsai | 358/133 |
| 4,982,282 | 1/1991 | Saito et al. | 358/133 |
| 5,045,925 | 9/1991 | Saito | 358/13 |
| 5,045,938 | 9/1991 | Sugiyama | 358/133 |
| 5,070,503 | 12/1991 | Shikakura | 371/37.1 |
| 5,073,821 | 12/1991 | Juri | 358/133 |
| 5,162,923 | 11/1992 | Yoshida et al. | 358/433 |
| 5,212,695 | 5/1993 | Shikakura et al. | 371/37.1 |
| 5,446,744 | 8/1995 | Nagasawa et al. | 371/37.4 |
| 5,565,992 | 10/1996 | Enari et al. | 358/261.3 |
| 5,566,002 | 10/1996 | Shikakura | 358/433 |

OTHER PUBLICATIONS

Signal Proc. of HDTV, II, Proc. 3rd Int. Workshop on HDTV, Aug. 1989, pp. 769–776, del Pero et al. "Criteria for the Protection of Video etc" Pat. Abs. Jp. vol. 14, No. 414, Sep. 7, 1990 and JP-A-2159186.

IEEE Trans. Consumer Electronics, vol. 35, No. 3 Aug. 1989, pp. 450–457, Yamamitsu et al. "An Experimental Study for a Home–Use Digital VTR" Pat. Abs. Jp. vol. 14, No. 362, Aug. 6, 1990 and JP-A-2127872.

Saito et al., Translated Publication, "Introduction to Image Data Compression Techniques: Still Picture Coding", The Journal of the Institute of Television Engineers of Japan, vol. 44, No. 2, Feb. 1990, pp. 153–161.

Primary Examiner—Robert W. Beausoliel, Jr.
Assistant Examiner—Stephen Elmore
Attorney, Agent, or Firm—Fitzpatrick, Cella, Harper & Scinto

[57] ABSTRACT

In this image coding method and apparatus, an image is divided into a plurality of areas. Information indicative of the image is variable length coded into data of, for instance (138×132) symbols. Boundary information corresponding to the area is transmitted after the data for each 128 symbols, after being variable length coded.

17 Claims, 9 Drawing Sheets

VARIABLE LENGTH ENCODING OF IMAGE DATA

BACKGROUND OF THE INVENTION

1. Field of the Invention

The invention relates to an image processing method and apparatus and, more particularly, to an image processing method and apparatus for highly efficient encoding image data and for generating a code for transmission or storage.

2. Related Background Art

Various kinds of image compression methods have conventionally been proposed. What is called an ADCT (adaptive discrete cosine transform) method has been proposed as a typical color image coding method.

According to the ADCT method, image data is DCT (discrete cosine transform) converted and is, thereafter, scalar quantized and, further, the scalar quantized data is Huffman coded, thereby reducing the amount of data and performing a variable length coding.

However, although such a variable length coding method has an excellent compression efficiency, when errors exist in the compressed data, decoding becomes impossible. Thus, there is a case where the portion of the image following the occurrence of the error fluctuates and becomes unsightly. When (e.g., for reasons of economy) the apparatus doesn't have an error detecting/correcting unit for a transmission path such as an optical fiber having a high error quality, such an image fluctuation rarely occurs. Or, if an error detecting/correcting unit is provided for protection from such errors, this results in increase in the cost of the apparatus. For instance, for a transmission path of a bad quality, as in satellite communication, an error detecting/correcting unit is indispensable to further prevent mixture of errors. It is necessary to assure a large redundant component such as a parity check or the like in order to enhance the error detecting/correcting capability for the variable length coding. Thus, compression efficiency, which would otherwise be substantial, deteriorates. Further, processing speed is raised, the amount of hardware needed is increased, and the costs of the apparatus rise. The above problems are not limited to the foregoing ADCT method.

The above problems will be further explained.

Figure 10:
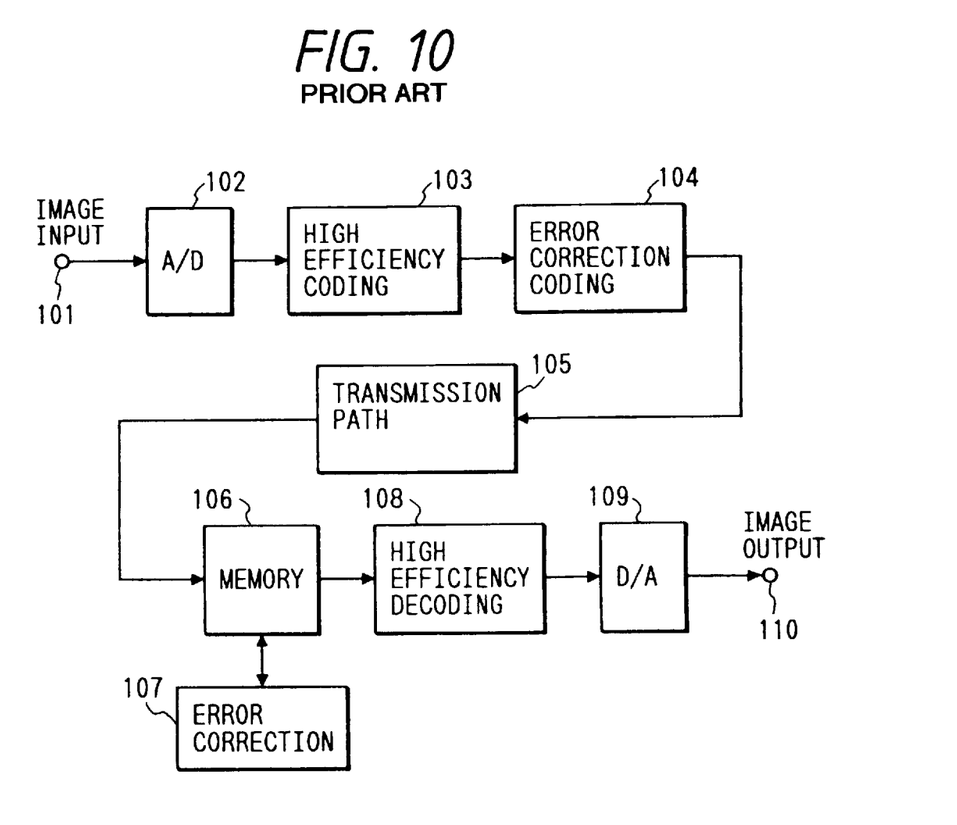
FIG. 10 is a block diagram showing an outline of a conventional image transmission/reception system.

FIG. 10 is a block diagram showing a schematic construction of a conventional image transmitting/receiving system.

In the diagram, reference numeral 101 denotes a terminal to which an image signal is supplied. The image signal sent from the terminal 101 is digitized by an A/D (analog-digital) converter 102. The digital image signal is coded by a highly efficient coding circuit 103 and thus the information amount (band) is compressed.

The image information compressed by the circuit 103 is supplied to an error correction coding circuit 104. A parity examination bit for correction of a coding error is added to the image information (i.e., the image information is error correction coded) and, after that, the image information is sent to a transmission path 105.

On the reception side, a data train transmitted through the transmission path 105 is stored into a memory unit 106 and is subjected to a code error correction using the above parity examination bit by an error correction unit 107, which accesses the memory unit 106. Image information in which code errors have been corrected is generated from the memory unit 106 and is supplied to a high efficiency decoding circuit 108. The decoding circuit 108 executes the process opposite to the process performed by the high-efficiency coding circuit 103. That is, the decoding circuit 108 expands the information amount (band) and returns to the original digital image signal. The digital image signal is then converted into an analog signal by a D/A (digital-analog) converter 109 and is generated as an analog image signal from a terminal 110.

Many various image compressing methods are proposed to realize a construction of the highly efficient coding circuit 103 in FIG. 10. The ADCT method is proposed as a typical one of the color image coding methods. The ADCT method is disclosed in detail in Takahiro Saito, et al., "The Coding Method of Still Image", in the Journal of the Institute of Television Engineers of Japan, Vol. 44, No. 2 (1990), and in Hiroshi Ochi, et al., "The International Standard Tendency for Still Image Coding", in the record of the national convention of The Institute of Image Electronics Engineering of Japan, No. 14 (1988), and the like.

Figure 6:
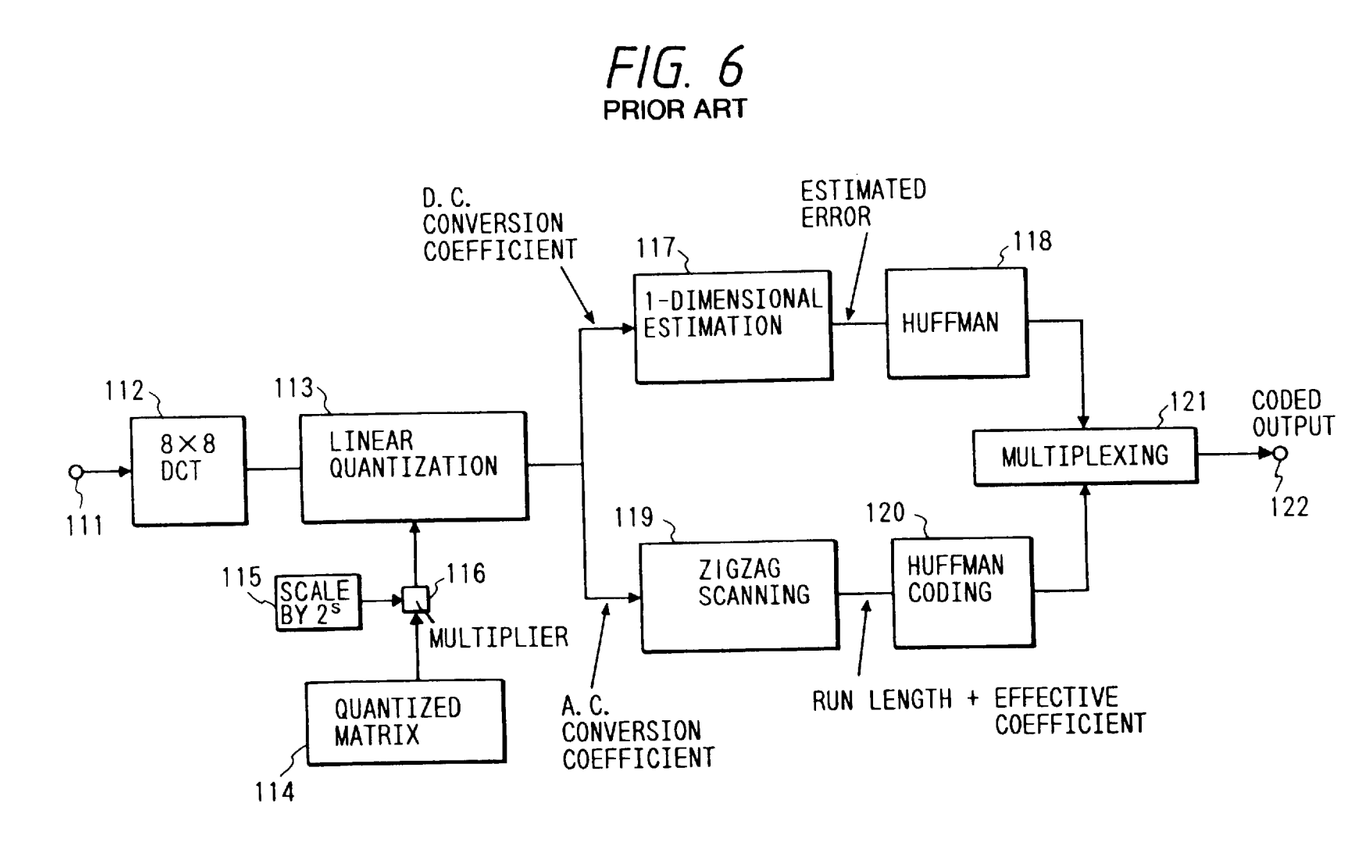
FIG. 6 is a diagram for explaining a variable length coding method for a conventional apparatus.

FIG. 6 is a block diagram showing schematically a construction of high-efficiency coding circuit using the above ADCT method.

In the diagram, it is assumed that a digital data train converted into eight bits per pixel per color component, namely, 256 gradations/color, through the A/D converter 102 in FIG. 10 is used as an image signal which is supplied to a terminal 111. The number of colors is set to be three or four colors such as RGB (red, green, blue), YUV, $YP_bP_r$, YMCK (yellow, magenta, cyan, black), or the like.

The input digital image signal is immediately subjected to a two-dimensional discrete cosine transform on a sub-block unit basis of (8×8) pixels by a DCT converter 112.

The DCT converted data of (8×8) words (hereinafter, referred to as conversion coefficients) is quantized by a linear quantization circuit 113. The quantization step sizes used in this process differ for every conversion coefficient. That is, the quantization step size for each conversion coefficient is set to a value in which (8×8) quantization matrix elements from a quantization matrix generating circuit 114 are multiplied by $2^S$ by a multiplier 116.

The quantization matrix elements are determined taking into consideration that visual sensitivities to quantization noises differ according to the conversion coefficient of (8×8) words. Table 1 shows an example of the quantization matrix elements.

TABLE 1

| Example of quantization matrix elements | | | | | | | |
|---|---|---|---|---|---|---|---|
| 16 | 11 | 10 | 16 | 24 | 40 | 51 | 61 |
| 12 | 12 | 14 | 19 | 26 | 58 | 60 | 55 |
| 14 | 13 | 16 | 24 | 40 | 57 | 69 | 56 |
| 14 | 17 | 22 | 29 | 51 | 87 | 80 | 62 |
| 18 | 22 | 37 | 56 | 68 | 109 | 103 | 77 |
| 24 | 35 | 55 | 64 | 81 | 104 | 113 | 92 |
| 49 | 64 | 78 | 87 | 103 | 121 | 120 | 101 |
| 72 | 92 | 95 | 98 | 112 | 100 | 103 | 99 |

The $2^S$ derived from a data generator 115. S is 0 or a positive or negative integer and is called a scaling factor. Picture quality and data amount are controlled by the value of S.

The DC component in each of the quantized conversion coefficients, namely, the DC conversion coefficient (hereinafter, referred to as a DC component) in the matrix of (8×8) is supplied to a one-dimensional estimation difference circuit 117. An estimation error obtained by the circuit 117 is Huffman coded by a Huffman coding circuit 118. Practically speaking, the quantization output of the estimation error circuit is classified into groups. The identification number of the group to which the estimation error belongs is first Huffman coded, and information indicative of the value in the group, is subsequently expressed by an equal-length code.

Figure 7:
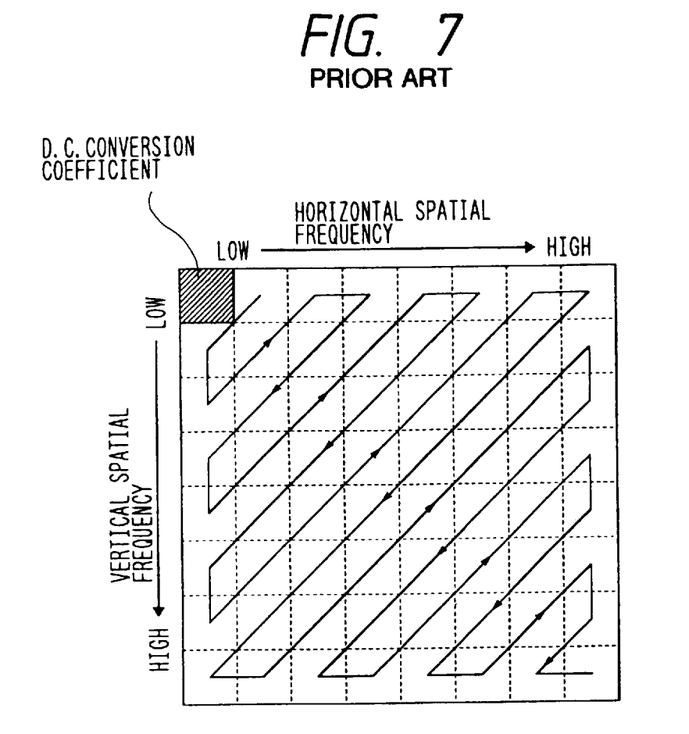
FIG. 7 is a diagram for explaining the details of the variable length coding method for a conventional apparatus.

The conversion coefficient other than the above DC component, that is, an AC conversion coefficient (hereinafter, referred to as an AC component) is supplied to a zigzag scanning circuit 119 and is zigzag scanned from the low frequency component to the high frequency component by a two-dimensional frequency as shown in FIG. 7. A set of the number (run length) of conversion coefficients in which the quantization output is not 0 (hereinafter, referred to as effective coefficients) and the number (run length) of conversion coefficients in which the quantization output is equal to 0 and which exist between the effective coefficients just before such conversion coefficients (hereinafter, referred to as ineffective coefficients) are generated from the zigzag scanning circuit 119 to a Huffman coding circuit 120.

In the Huffman coding circuit 120, an output signal from the scanning circuit 119 is classified into groups in accordance with the values of the effective coefficients and Huffman codes a set of the group identification number and the above run length. Subsequently, information indicative of which value in the group is expressed by an equal length code.

Outputs from the Huffman coding circuits 118 and 120 are multiplexed by a multiplexing circuit 121 and supplied as a coded output from a terminal 122 to the error correction coding circuit 104 at the post stage.

According to the highly efficient coding as mentioned above, even when the information amount is compressed into a fraction of an integer, the image quality never deteriorates, and an extremely efficient compression can be performed.

However, when the compression of high efficiency as mentioned above, namely, the information compression at a high compression ratio, is executed, the effect on the image of even a single code error is serious.

For instance, in a case where variable length coding as mentioned above is performed, subsequent decoding cannot be executed at all for the image following the occurrence of the error, as the image fluctuates and is quite unsightly.

On the other hand, generally, in the case of executing such a compression of high compression ratio, if an uncorrectable code error occurs in a significant code such that it becomes a key upon decoding, the reproduced image is damaged.

In recent years, particularly, a kind of apparatus is also used for a transmission path such that the transmission quality can change depending on the weather, and deteriorates, as in satellite communication. A countermeasure to protect data against the generation of errors on the transmission path is required.

However, when standard countermeasures for errors are merely enhanced, the resulting increase in redundancy of the code is made in vain. Even when a highly efficient image compression is executed, its benefit is lost.

SUMMARY OF THE INVENTION

It is an object of the invention to provide an image processing method and apparatus in consideration of the foregoing problems.

Another object of the invention is to provide an image processing method and apparatus which can also preferably transmit image data even on a transmission path of poor quality.

Still another object of the invention is to provide an apparatus and method which can reduce an influence exerted on information by a code error in a transmission path, and which can also decrease a redundancy of data.

According to a preferred embodiment of the invention under the above object, there is disclosed an image coding apparatus in which each picture plane is divided into a plurality of regions, a variable length coding is executed on a region unit basis, and data is transmitted on a data block unit basis which time sequentially includes the variable length coded generation code and additional information, wherein boundary information indicative of the position in the data block of the boundary between the generation codes of the divided regions is transmitted as a part of the additional information, and a first error detection or correction code for a code word including the generation codes and boundary information and a second error detection or correction code for a code word which includes the boundary information and doesn't include the generation codes are formed in each data block.

According to the apparatus of the above embodiment, even when an uncorrectable code error occurs, decoding can be performed on each region unit basis on each picture plane so long as the boundary information can be reproduced. Thus, fluctuation of the image after the occurrence of the error can be reduced.

On the other hand, with respect to the boundary information, the probability with which errors can be corrected or detected by the first or second error detection or correction code is high, and there is no situation in which the variable length coded generation code is decoded using the wrong boundary information. Thus, a good image in which the effect of a code error hardly becomes a problem in the human sense of sight can be reproduced.

Still another object of the invention is to provide a novel image processing method and apparatus using the orthogonal transformation.

Yet another object of the invention is to provide an image processing method and apparatus suitable for a color image.

The above and other objects and features of the present invention will become apparent from the following detailed description and the appended claims with reference to the accompanying drawings.

DETAILED DESCRIPTION OF THE PREFERRED EMBODIMENTS

Figure 1:
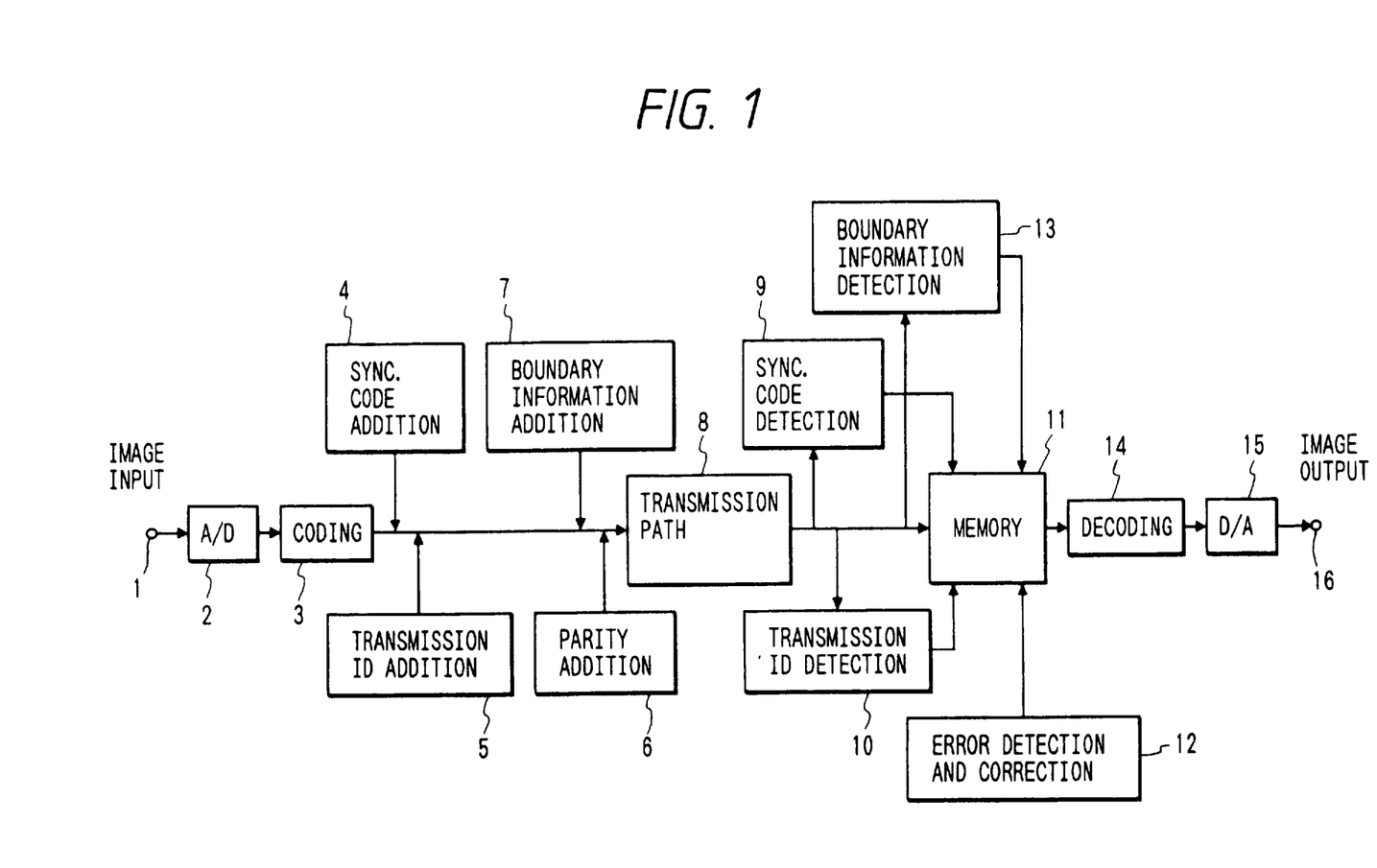
FIG. 1 is a block diagram showing a construction of the first embodiment of the invention.

An embodiment of the invention will be described hereinbelow with reference to the drawings. FIG. 1 is a block diagram showing a construction of an image coding apparatus according to an embodiment of the invention. An analog image signal supplied from a terminal 1 is converted into a digital signal by an A/D converter 2 and is variable length compression coded by a high-efficiency coding unit 3. A sync code is added to a coded output by a sync code addition unit 4. A transmission ID is added to the output signal by a transmission ID addition unit 5. A parity and an error check code for subsequent error detection and correction and added to the output signal by a parity addition unit 6. Reference number 7 denotes a boundary information addition unit, which will be explained below. When generation codes to respective divided regions of the same size before coding are transmitted, the boundary information addition unit 7 generates a flag at every boundary. Reference numeral 8 denotes a transmission path. In a case of immediate transmission, the transmission path is a transmission medium such as ground ratio wave, light space, or the like of an optical fiber, a satellite, a microwave, or the like. In the case of accumulation transmission, the transmission path is a memory medium such as tape-shaped medium of a digital VTR (videotape recorder), a DAT (digital audio tape), or the like, a disk-shaped medium such as a floppy disk, optical disk, or the like, or a solid medium such as a semiconductor memory etc., or the like.

The transmission rate in this embodiment is determined by the information amount of the original image, the compression ratio, and the required transmission time and can be set to various values within a range from tens of kbits/sec to tens of Mbits/sec.

On the other hand, the data received from the transmission path 8 is first synchronized by a sync code detection unit 9. An attribute of the transmission synchronization is detected by a transmission ID detection unit 10 on the basis of the ID and is once accumulated into a memory 11. In an error detection and correction unit 12, errors on the transmission path are detected and corrected by using the foregoing parity and error check code. Further, in a boundary information detection unit 13 in the embodiment, the boundaries of the compression coding portions of the divided regions are detected. In a decoding unit 14, the variable length data is expanded and decoded. The decoded digital signal from the decoding unit 14 is converted into the analog signal by a D/A converter 15. An image is generated from a terminal 16.

Figure 2:
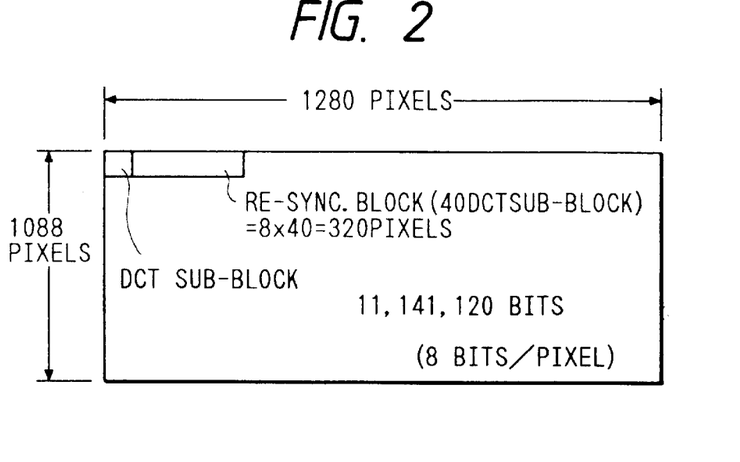
FIG. 2 is a diagram showing an image to be transmitted in the first embodiment of the invention.

The operation of this embodiment will now be further described in detail with reference to FIGS. 2 to 5. FIG. 2 shows an example of an image to be transmitted. An image of one picture is constructed of 1280 pixels in the lateral direction and 1088 pixels in the vertical direction. Each pixel consists of eight bits and is an A/D converted image. The amount of data capacity needed per picture in this example is $$1280 \times 1088 \times 8 = 11,141,120 \text{ (bits)}$$

In this embodiment, it is assumed that moving images are transmitted. To transmit moving images of 30 images per second, the transmission rate is thus $$11,141,120 \times 30 = 334,233,600 \text{ bits/sec}$$

Explanation will now be made with respect to the case where the above image information is compressed and coded to about 1/10 by, for example, an ADCT method, and is then transmitted.

It is now assumed that the block comprising 8 pixels (in the lateral direction)×8 pixels (in the vertical direction) is set to be one DCT sub-block. As shown in FIG. 2, one re-sync block is constructed of 40 consecutive DCT sub-blocks in one image to be transmitted. When one picture plane is divided on a re-sync block unit basis, it is divided into a total of 544 re-sync blocks of 4 re-sync blocks (in the lateral direction)×136 re-sync blocks (in the vertical direction). Now, assuming that each pixel is 8-bit data, the data capacity before compression per re-sync block is equal to $$40 \times 8 \times 8 \times 8 = 20,480 \text{ (bits)}$$

Boundary information, which will be explained below, is information indicative of the boundaries of the foregoing re-sync blocks.

Figure 3A:
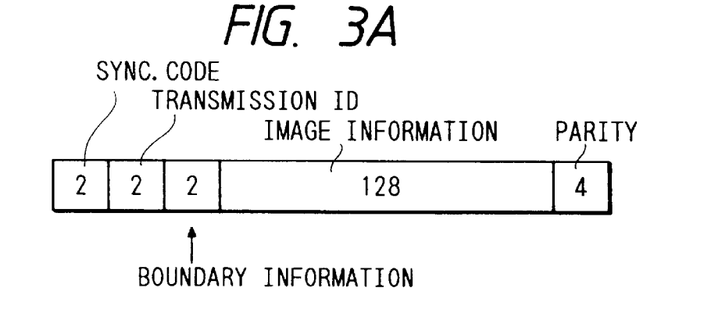
FIGS. 3(A) and 3(B) are diagrams showing the transmission synchronization in the first embodiment of the invention.
Figure 3B:
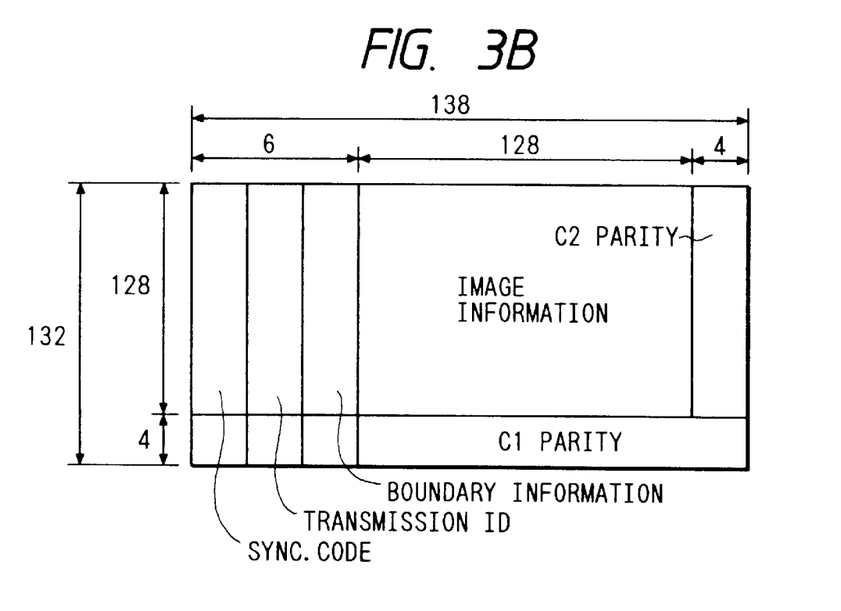

FIG. 3(B) shows a format of the transmission synchronization (ECC block) in this embodiment. In the present embodiment, for instance, the format is set to a two-dimensional construction using a well-known double Reed Solomon code as an error detection and correction code. In the embodiment, since the image data is compressed by the DCT method, the compressed information of the image to be transmitted is set to the variable length code. However, a $C_2$ parity of four symbols is added to 128 symbols (hereinafter, one symbol=8 bits) in the lateral direction of such a variable length code. A $C_1$ parity of four symbols is also added to 128 symbols in the vertical direction of the image information. Thus, error correction of errors, until 2-symbol error occurs, can be performed in each direction.

A sync code of two symbols, a transmission ID of two symbols, and boundary information of two symbols according to the embodiment are added to the portion of one lateral train in FIG. 3(B), namely, 128 symbols of the coded image information and four symbols of the $C_2$ parity or to 132 symbols of all of the $C_1$ parities. One transmission block in which all of them are combined is shown in FIG. 3(A). One ECC block is constructed by 132 transmission blocks each comprising the image information, $C_1$ and $C_2$ parities, sync code, transmission ID, and boundary information in FIG. 3(A).

When one picture plane of the image to be transmitted is coded so as to give ten ECC blocks, a transmission capacity of $$128 \times 128 \times 8 \times 10 = 1,310,720 \text{ bits/image}$$

is given to the data which is allocated to the image information excluding the sync code and the like. That is, it is sufficient to compress and encode the image to be transmitted to about 11% of the original image data amount. FIG. 3(A) is a diagram showing a state in which the data of one symbol in the data shown in FIG. 3(B) is cut out in the row direction as mentioned above.

In the case of performing the above compression to the moving images in which, for instance, 30 images are transmitted per second, a transmission capacity of $$128 \times 128 \times 8 \times 10 \times 30 = 39,321,600 \text{ bits/sec}$$

is given. A transmission rate necessary to transmit all of the data also including the additional information except the image information at that time is equal to or larger than 138×132×8×10×30 43,718,400 bits/sec The sync code in FIGS. 3(A) and 3(B) is used to detect the synchronization of the transmission block and includes a predetermined fixed pattern. The transmission ID is data indicative of the number of the transmission block which is necessary to transmit one image. In the present embodiment, since the transmission ID consists of 16 bits, $2^{16}$=about 65000 kinds of transmission blocks can be expressed by using the transmission ID. In the case of the present embodiment, since the number of transmission blocks is set to 132×10=1320, it is sufficient to use 11 bits.

Figure 4A:
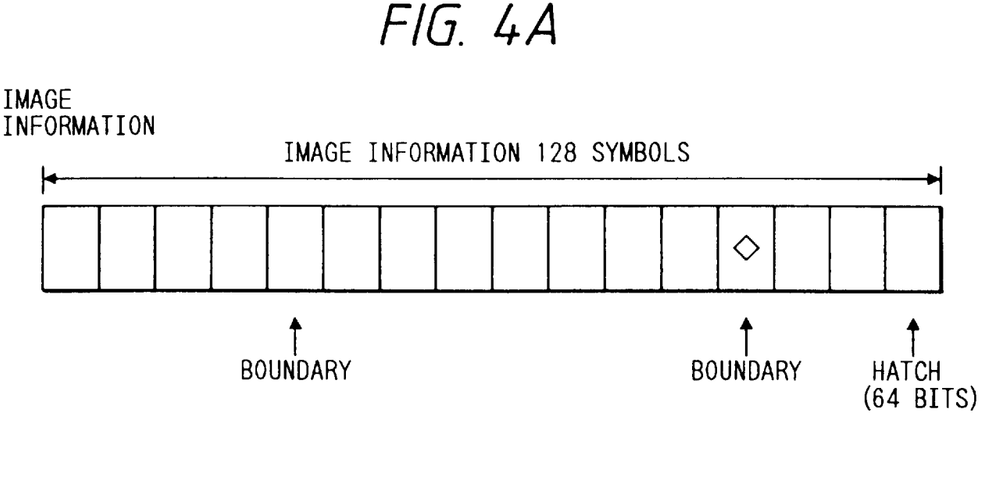
FIGS. 4(A) and 4(B) are diagrams showing the correspondence with the transmission synchronization in the first embodiment of the invention.
Figure 4B:
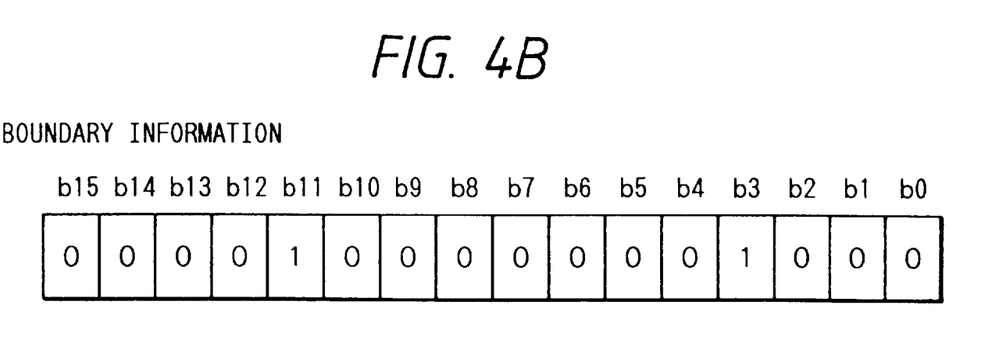

FIGS. 4(A) and 4(B) show the relations between the boundary information (FIG. 4(B)) in this embodiment and the image information (FIG. 4(A)) in FIGS. 3(A) and 3(B). For the image information which has been variable length compressed, the image information region of 128 symbols in FIGS. 3(A) and 3(B) is divided into hatches (small rooms) each consisting of eight symbols, namely, every 64 bits. The boundary information corresponds to one re-sync block of the image data before compression. The boundary information of one bit corresponds to one hatch. Therefore, a total of 16 bits of the boundary information correspond to the 16 hatches. For instance, as shown in FIG. 4(A), assuming that the boundaries of the re-sync of the image to be transmitted exist at the fifth and thirteenth hatches from the left, a bit "1" is set to the fifth and thirteenth positions from the left of each bit of the boundary information corresponding to the above boundaries. (A bit "0" is set to the other portions.) First the number (re-sync number) of two symbols (16 bits) indicative of the first re-sync block is generated for the re-sync block. The image compression information is generated from the third symbol.

Figure 5:
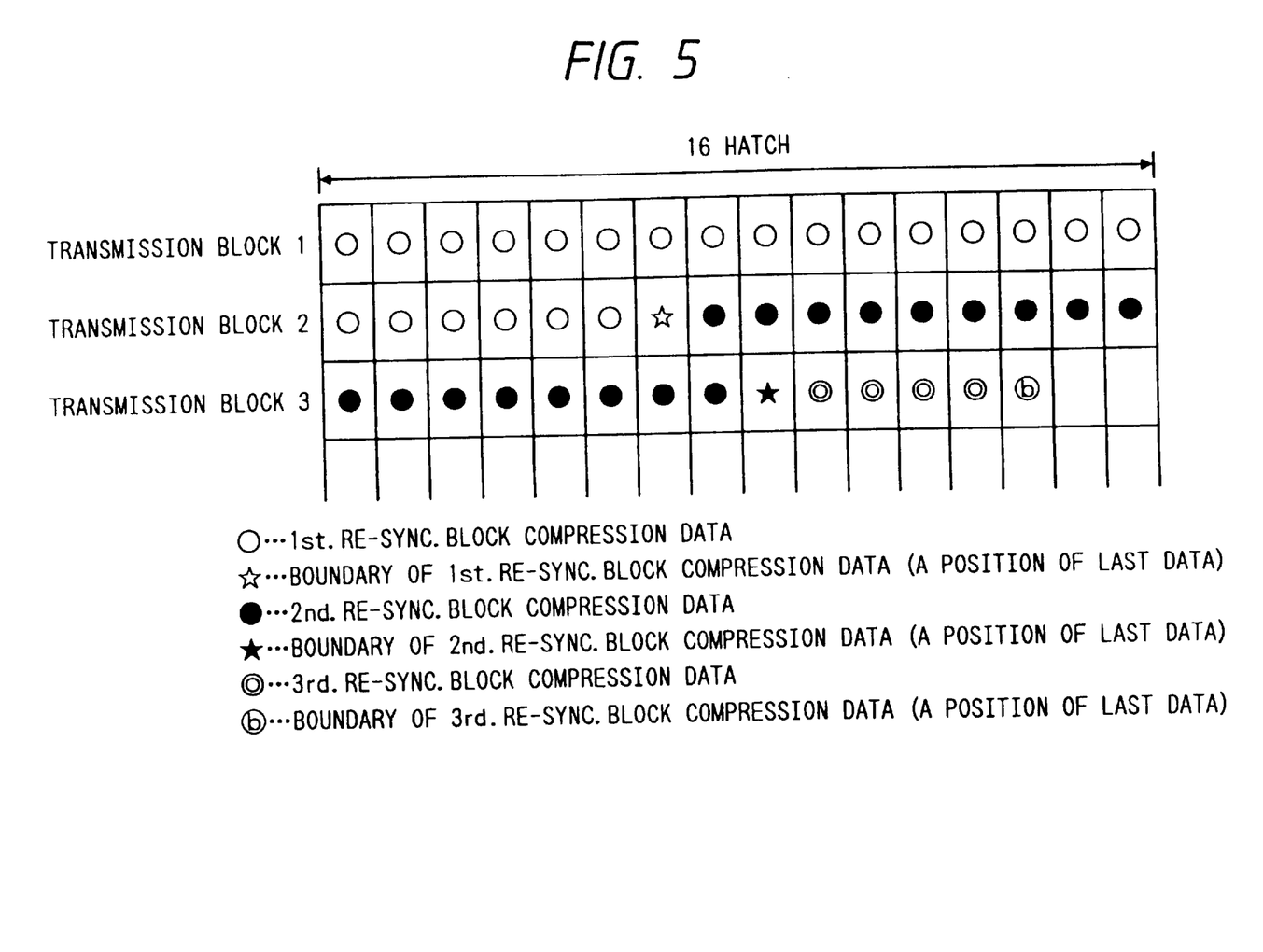
FIG. 5 is a diagram showing a transmitting method of the first embodiment of the invention.

FIG. 5 shows a transmission format of the compressed image data. The first re-sync block is DCT converted by the DCT converter 112 on a sub-block unit basis of (8×8) pixels by a construction shown in FIG. 6. After that, the DCT conversion coefficients are linearly quantized by the linear quantization circuit 113. The quantization step sizes differ every coefficient which has been DCT converted. The quantization step size for each conversion coefficient is set to the value in which the quantization matrix elements of 8×8 shown at 114 were multiplied by $2^S$ times by the scaling factor $2^S$ from circuit 115 in consideration of the difference of every conversion coefficient of the visual sensitivity to the quantization noise. S denotes a scaling factor and is set to 0 or a positive or negative integer. By variably setting the value of S, the picture quality and the generation data amount are controlled and the generation data amount is compressed to about 1/10. After completion of the quantization, with respect to the DC component, a one-dimensional estimation is performed by the 1-dimensional estimation circuit 117 between the adjacent sub-blocks as a difference value from 0 in the first DCT sub-block. Further, the estimation error is Huffman coded by the Huffman coding circuit 118. That is, the quantization outputs of the estimation errors are classified into groups. The identification number of the group to which the estimation error belongs is Huffman coded. Further, information indicative of which value in the group is subsequently expressed by an equal length code. On the other hand, as for the AC component, the quantization output is zigzag scanned from the low frequency component to the high frequency component by the zigzag scan circuit 119. FIG. 7 shows such a zigzag scan.

The above scan output is encoded by the Huffman coding circuit 120. That is, the effective coefficients (that is, the coefficients other than "0") are classified to either one of a plurality of groups to which the values belong. The group ID number and the number of ineffective coefficients sandwiched between the effective conversion coefficient just before the ineffective coefficient and the next effective coefficient are constructed to one set. Such a set is Huffman coded. Subsequently, information indicative of which value in the group is expressed by an equal length code. The above coding operation is first executed to the first 40 DCT sub-blocks, namely, to the first re-sync block. The generated variable length codes are combined to a symbol which is constructed by eight bits and generated to the image information region of the transmission block. For the hatch (shown by * in FIG. 5) including the last bit of the information in which the 40 DCT sub-blocks are compressed, nothing is written into the remaining regions other than the data until the last bit of the hatch (capacity is set to 64 bits) and those regions are set as undefined bits. A flag "1" is set as the boundary information to the hatches at this time.

Subsequently, for the second re-sync block, the number (re-sync number) of two symbols (16 bits) indicative of the second re-sync block from the beginning of the hatch next to the hatch used in the first re-sync block is generated to symbols of the transmission ID in FIGS. 3(A) and 3(B). The image compression information is generated from the third symbol. With respect to the DC component, in the first DCT sub-block, the 1-dimensional estimation is executed between the adjacent sub-blocks as a differential value from 0 and the estimation errors are Huffman coded in a manner similar to the above. The quantization outputs of the estimation errors are classified into groups. First, the ID number of the group to which the estimation error belongs is Huffman coded. Subsequently, information indicative of which value in the group is expressed by an equal length code.

On the other hand, the quantization output of the AC component is zigzag scanned from the low frequency component to the high frequency component and is encoded. The generated variable length codes are combined to a symbol constructed by eight bits and generated to the image information region of the transmission block. For the second re-sync block as well, to the hatch (shown by * in FIG. 5) including the last bit of the information in which the 40 DCT sub-blocks are compressed, nothing is written into the remaining regions in such a hatch, and undefined bits are set for those regions. A flag "1" is set as the boundary information for the hatch at that time.

The above processes are continued up to the last re-sync block in a manner similar to the above.

A construction of the apparatus on the decoding side will now be described. In FIG. 1, the data received from the transmission path 8 is first synchronized by the sync code detection unit 9. The attribute of the transmission synchronization is detected on the basis of the ID by the transmission ID detection unit 10 and is once stored into the memory 11 after that. A memory capacity in this embodiment is equal to or larger than the compressed information amount of the target image. In the error correction unit 12, errors on the transmission path are detected by using the $C_1$ and $C_2$ parities in FIGS. 3(A) and 3(B) and are corrected. The memory 11 has areas to store the image information in the data which is supplied through the transmission path 8 and the $C_1$ and $C_2$ parities. The memory 11 also has a memory controller C to control addresses in the memory area on the basis of the data detected by the sync code detection unit 9, transmission ID detection unit 10, and boundary information detection unit 13.

With respect to the image information in the area to store the $C_1$ and $C_2$ parities, the error detection and correction unit 12 detects and corrects the errors.

The operation of the memory 11 will now be described.

First, with regard to the first re-sync block, since it is the beginning of the information, the image information is sent to the decoding unit at the post stage from the next third symbol of the first two symbols (re-sync number). For the second re-sync block, the last hatch of the first re-sync block is subsequently detected by the boundary information detection unit 13 in the embodiment. The image information is sent to the decoding unit from the third symbol in the next hatch. The above operation is similarly executed with respect to the third and subsequent re-sync blocks. In the case where errors cannot be corrected in the error detection and correction unit 12, and only error detection can be performed, it is sufficient to correct on the re-sync block unit basis mentioned above. For instance, it is sufficient to correct the error detected re-sync block by using the data of the adjacent re-sync blocks. Or, in the case of a moving image, it is sufficient to correct by using the data of the re-sync block corresponding to the previous picture plane on such a re-sync block unit. In brief, it is sufficient to perform the correction on a re-sync block unit basis.

On the other hand, in a case where the quality of the transmission path deteriorates significantly and the error detection and correction unit has performed the error correction while exceeding the error correcting capability, or in the case where the boundary information is broken, at a time point when the quality of the transmission path was recovered, new boundary information is detected, and the re-sync number as first two symbols in the next hatch of the hatch in which the boundary flag is set is read. Thus, the true re-sync block is returned and from this time point on, a complete image can be reproduced.

According to this embodiment as described above, it is possible to provide an image coding apparatus in which the feature of the variable length coding method having an excellent compression efficiency is not lost, and even in a case where errors should happen to be mixed to the transmission path, the quality of the transmission path deteriorates significantly and the error detection and correction unit has performed the error correction while exceeding the error correcting capability, at a time point when the quality of the transmission path was recovered, by detecting new boundary information, the true re-sync block is returned and from this time point on, a complete image can be reproduced, and an extremely good image which does not appear disturbed, in terms of the human sense of sight, is reproduced.

Therefore, it is possible to provide an image coding apparatus having no error detection and correction unit for the transmission path such as an optical fiber of a high error quality for the purpose of reduction in costs of the apparatus. On the other hand, for a transmission path such as a satellite channel of a bad quality, it is possible to provide a small cheap image coding apparatus in which there is no need to assure a large redundant component such as parities to enhance the error detecting and correcting capability for the variable length coding and the substantial compression efficiency is not deteriorated.

In the present embodiment, although an example of the ADCT coding method has been described as a method of performing the variable length coding on a 2-dimensional block unit basis, the invention is not limited to such a method. Another method such as a method of arithmetically encoding by pre-processing after completion of the orthogonal transformation can be also used so long as it is a method of performing the variable length encoding on a 2-dimensional block unit basis.

According to the embodiment described above, the invention has been described with respect to the image coding apparatus having the error detection and correction unit 12. However, the invention can be also obviously easily applied to an image coding apparatus having no error detection and correction unit which is used on the transmission path in which errors are very rarely mixed, like an optical fiber. The invention also is not limited to a coding apparatus for a moving image, a semi-moving image, or a still image. The number of bits of the boundary information, the number of hatches, the method of dividing the hatches, the definition name, and the like are not particularly limited to those mentioned above.

According to the foregoing embodiment, even in a case where errors should happen to be mixed with the compressed data, fluctuation of the image after the occurrence of errors is reduced, and an image which is good in the human sense of sight can be reproduced.

Figure 9:
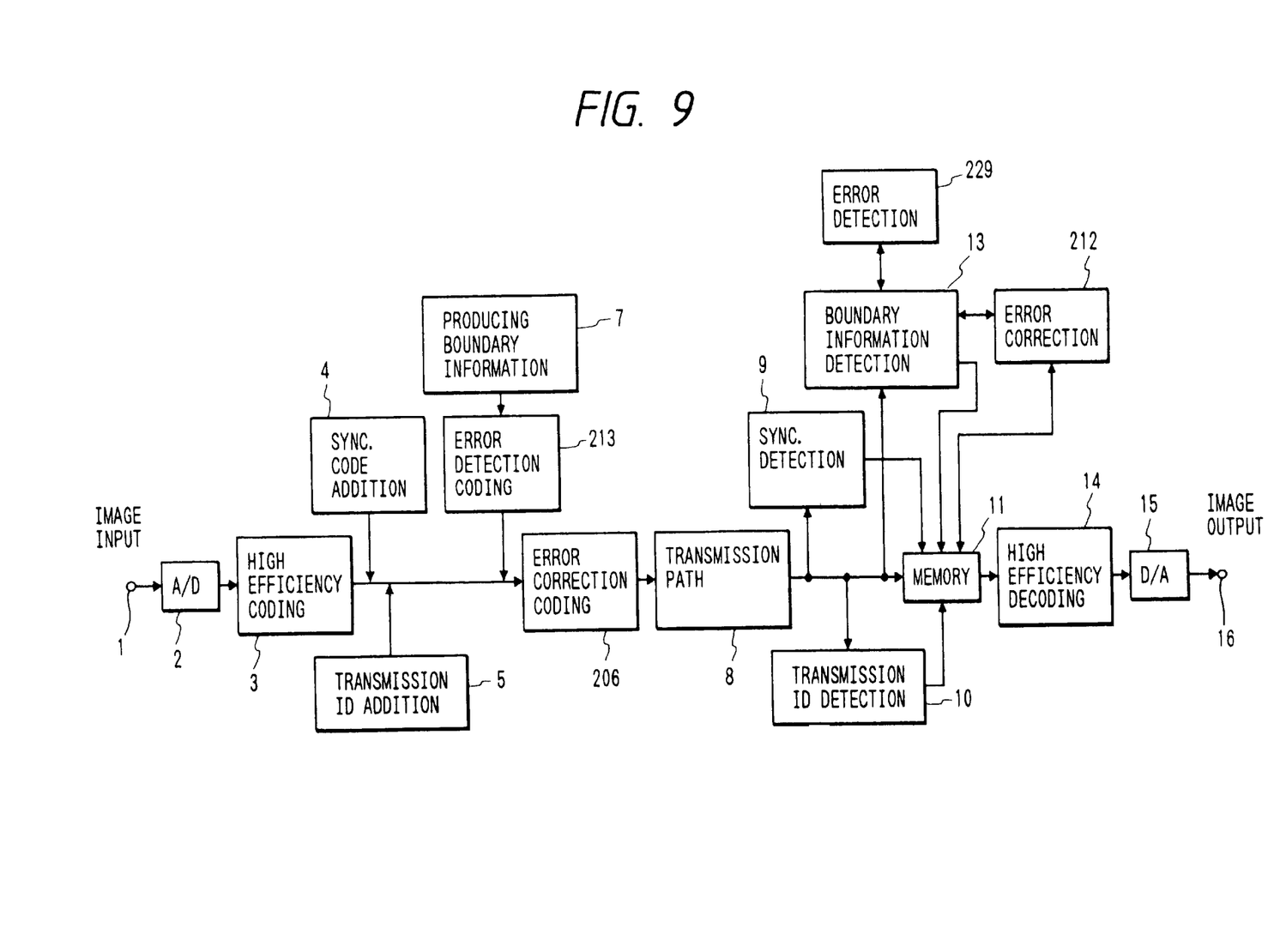
FIG. 9 is a block diagram showing a construction of the second embodiment of the invention.

FIG. 9 is a block diagram showing a schematic construction of an image transmission reception system as a second embodiment of the invention. The second embodiment of the invention will be described below with reference to FIG. 9. In FIG. 9, the component elements having the same functions as those in FIG. 1 are designated by corresponding reference numerals.

The analog image signal supplied from the input terminal 1 is converted into the digital signal by the A/D converter 2. The digital signal is subjected to the variable length compression coding process by the high efficiency coding unit 3 in a manner similar to the foregoing conventional apparatus. A sync code is inserted at a predetermined position of the compression encoded data train by the sync code addition unit 4.

Further, the transmission ID addition unit 5 inserts the addition information (transmission ID) regarding the transmission of the system, for instance, the sync block number, into the data train.

Reference numeral 7 denotes the circuit to produce the boundary information. As mentioned above, the boundary information shows the boundaries of the information (generation codes which have been variable length coded) of the respective regions in which one picture plane is divided into a plurality of regions. The boundary information is the significant information. An examination bit of the error detection code is added by an error detection coding circuit 213 and inserted into the data train. The error detection coding circuit 213 forms a second error detection or correction code.

Reference numeral 206 denotes an error correction coding circuit and executes the error correction coding to the boundary information and the compression coded image data (generation codes) in a manner similar to the parity addition unit 6 in FIG. 1. The error correction coding circuit 206 forms the first error detection or correction code.

The parity examination bit of the error correction code is inserted from the error correction coding circuit 206 to a predetermined position of the data train mentioned above and is transmitted by the transmission path 8.

As for a transmission path 8, as an immediate transmission path, it is possible to presume a transmission medium such as ground radio wave, light space, or the like of an optical fiber, satellite, microwave, or the like. As an accumulation transmission path, it is possible to presume a recording medium such as a tape-shaped medium of a digital VTR, a DAT, or the like. a disk-shaped medium such as floppy disk, optical disk, or the like, or a solid-state medium such as a semiconductor memory, etc., or the like.

The transmission rate is determined by an original image information amount, a compression ratio, and a required transmission time and is set into various values within a range from tens of kbits/sec to tens of Mbits/sec.

The data train received on the reception side through the transmission path 8 are supplied to the sync code detection unit 9 and the foregoing sync code is separated and detected. In the transmission ID detection unit 10, the foregoing transmission ID is detected and the detection of the attribute of each sync block or the like is performed.

The boundary information detection unit 13 separates and detects the foregoing boundary information. The memory 11 stores the data train in accordance with the sync code and the transmission ID. The memory 11 has a capacity of one picture plane or more. To receive the moving image data, the memory needs to have a capacity of a plurality of picture planes or more.

An error correction unit 212 accesses to the memory 11 and the memory in the boundary information detection unit 13 and corrects the code errors for the compression coded image data and the boundary information. It will be obviously understood that the above error correction is executed by using the examination bit added by the foregoing error correction coding circuit 206.

On the other hand, an error detection unit 229 detects the code errors regarding the boundary information after completion of the error correcting process by using the examination bit added by the error detection coding unit 212. According to the present embodiment as mentioned above, since the double error correction and detection are performed to the boundary information, the reliability of the boundary information which is reconstructed on the reception side can be improved.

The boundary information detection unit 13 detects the boundaries on the compression coded data train of the regions which are obtained by dividing one picture plane and supplies the detected boundary information to the memory 11. The high-efficiency decoding unit 14 fetches only the variable length coded image data in accordance with the boundary information and expands and decodes to the digital image signal whose information amount (zone) is returned to the original amount. Then, the decoding unit 14 supplies the digital image signal to the D/A converter 15. Thus, the analog image signal is generated from an output terminal 16.

When the variable length data is expanded and decoded in the high efficiency decoding unit 14, if the boundaries on the compressed data train of the respective divided regions are erroneously detected, the correct decoding process is not executed and the image cannot be reproduced. However, in the present embodiment, the error correction can be performed on the boundary information by the error correction code as mentioned above. Further, such erroneous correction of the error correction code can be also detected by the error detection code. Thus, accurate boundary information can be reproduced on the reception side.

The second embodiment will now be described mainly with respect to points which are different from the first embodiment.

The data capacity and size of each of the cylinder blocks which are obtained by dividing the image of one picture plane every region are similar to those in the first embodiment.

Figure 8:
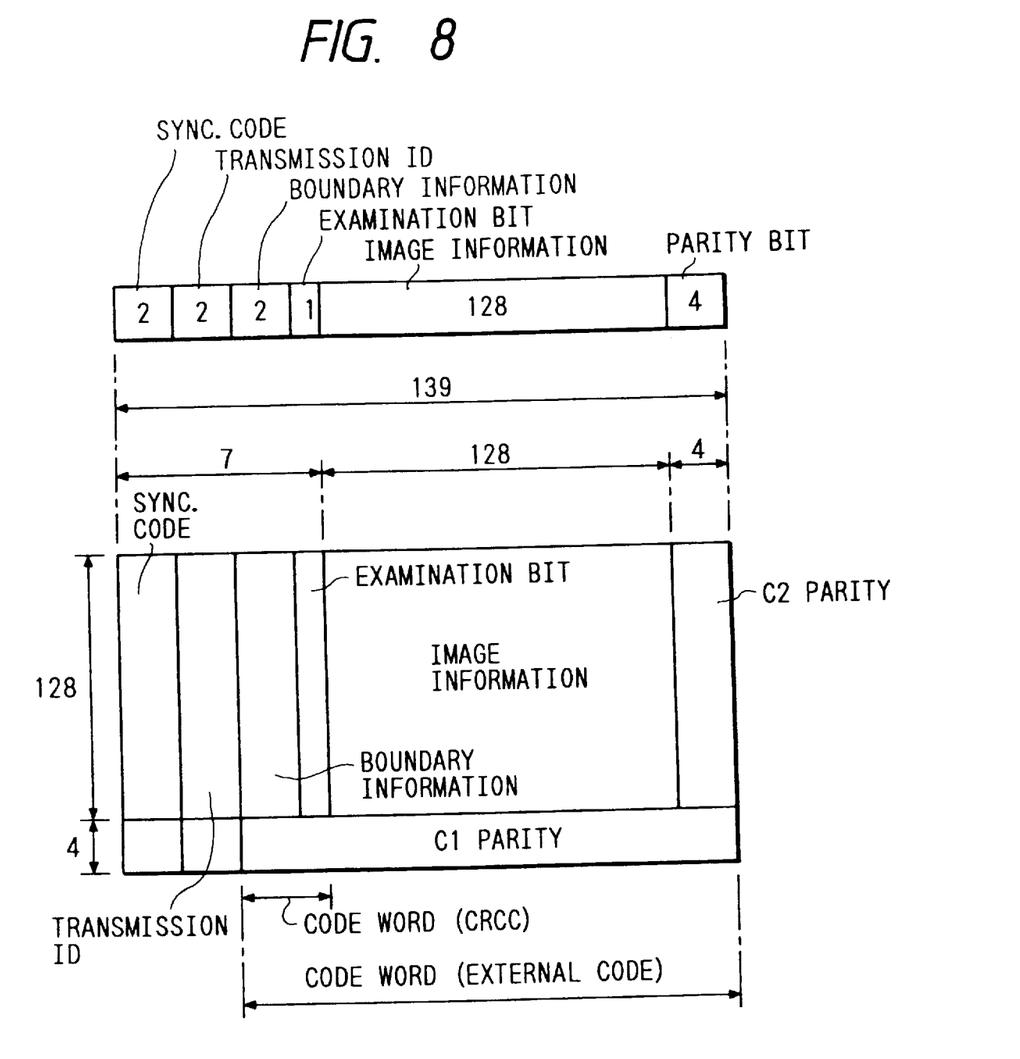
FIG. 8 is a diagram showing the transmission synchronization of the second embodiment of the invention.

The second embodiment is characterized by the transmission format described in FIG. 3 being set as shown in FIG. 8.

FIG. 8 shows a data transmission format in the system of this embodiment and, more particularly, shows a format of an error correction block (ECC block). According to the present embodiment, as shown in the diagram, an examination (check) bit of the CRCC (Cyclic Redundancy Check Code) of one symbol (8 bits) is added to the boundary information of two symbols.

The example in the case of using the double Reed Solomon code as an error correction code for the boundary information and the compression coded image information is shown.

FIG. 8 shows a range of code word of the error detection code by the CRCC and a range of code word of the error correction code by an external code of the double Reed Solomon code. As will be obviously understood from FIG. 8, the CRCC examination bit of one symbol is added to the boundary information of two symbols. The other aspects of the data construction are similar to those of FIGS. 3(A) and 3(B).

As mentioned above, in the error correction unit 206, the errors of the boundary information and the compressed image data are corrected. Further, in the error detection unit 229, the errors existing in the boundary information are detected even in the case where an overlook or an erroneous correction of the errors occurs in the correcting process of the error correction code. Therefore, the correct boundary information can be accurately extracted, thereby preventing the wrong boundary information from being used in the decoding process of the compression code.

In the second embodiment, the code word is formed by adding the examination bit of the error detection code to the boundary information. The code word is formed by adding the examination bit of error correction code to the boundary information and the compressed image information generation code. However, a similar effect is also derived by forming the code word of the error correction code to either the boundary information or the compressed image information generation code.

According to the embodiment as described above, the boundary information indicative of the position of the boundary of the generation code between the respective regions on the screen in each data block is transmitted as additional information, so that the correct decoding operation can be performed by reconstructing the boundary information upon decoding. Moreover, the boundary information can be strongly protected by not only the first error detection or correction code but also the second error detection or correction code of a short code word. Therefore, adverse influences of the reproduced image associated with the generation of code errors can be very greatly reduced without largely increasing the redundancy designed into the coding scheme.

What is claimed is:

1. An image transfer apparatus comprising:

a) input means for inputting image data;

b) dividing means for dividing the image data input by said input means into a plurality of first data blocks;

c) coding means for variable length coding each first data block into variable length code to produce a respective coded data block;

d) producing means for producing a sync block including a plurality of the coded data blocks in a sequence and additional information related to the included coded data blocks, and wherein the sync block further includes boundary information indicating a position in the sync block of a boundary between two of the coded data blocks adjacent each other in the sequence; and e) transfer means for transferring the sync block produced by said producing means.

2. An image transfer apparatus according to claim 1, wherein said coding means includes transformation means for subjecting the image data of each first data block to an orthogonal transformation.

3. An image transfer apparatus according to claim 1, wherein said producing means includes:

f) first error detection and correction means for forming first error check codes for the coded data blocks and the boundary information within the sync block; and g) second error detection and correction means for forming second error check codes for the boundary information excluding the coded data blocks within the sync block.

4. An image transfer apparatus comprising:

a) coding means for performing variable length coding of plural regions of image data to produce respective regions of image codes, where the image data resulted from dividing each of plural pictures provided as an image signal;

b) block forming means for forming a data block including the regions of image codes in a sequence;

c) boundary information forming means for forming boundary information indicating a position, in the data block, of a respective boundary between each two of the regions of image codes adjacent each other in the sequence; and d) transfer means for transferring the data block produced by said block forming means and the boundary information.

5. An image transfer apparatus according to claim 4, wherein the coded data within each data block comprises plural hatches, and the boundary information indicates a position within said data block for each hatch.

6. An image transfer apparatus according to claim 5, wherein said coding means adds a variable bit so that an information quantity of the coded data in each area is an integer multiple of the information quantity of the hatch.

7. An image transfer apparatus according to claim 4, wherein said block forming means comprises:

e) first error detection and correction means for forming first error check codes for the image codes and the boundary information within the data block; and f) second error detection and correction means for forming second error check codes for the boundary information excluding the image codes within the data block.

8. An image transfer apparatus according to claim 4, wherein said coding means further comprises:

e) blocking means for formulating the image data input by said input means into blocks; and f) transformation means for subjecting the image data of each block to an orthogonal transformation.

9. An image transfer apparatus according to claim 4, wherein the data block comprises a predetermined number of the regions.

10. A decoding apparatus for decoding transferred image data transferred in a data block including plural regions of coded data generated by subjecting , to variable length coding, image data resulting from dividing each of plural pictures provided as an image signal, the data block further including boundary information indicating a position, in the data block, of a respective boundary between each two of the regions adjacent each other in sequence, said apparatus comprising:

a) extracting means for extracting the boundary information; and b) decoding means for decoding the coded data based on the boundary information extracted.

11. An image transfer method comprising the steps of:

a) inputting image data;

b) dividing the image data input by said input step into a plurality of first data blocks;

c) variable length coding each first data block into variable length code to produce a respective coded data block;

d) producing a sync block including a plurality of the coded data blocks in a sequence and additional information related to the included coded data blocks, and wherein the sync block further includes boundary information indicating a position in the sync block of a boundary between two of the coded data blocks adjacent each other in the sequence; and e) transferring the sync block produced by said producing step.

12. An image transfer method comprising the steps of:

a) dividing an input image signal of a picture into plural areas of image data;

b) coding the image data in the divided areas into variable length code to produce respective areas of coded data;

c) producing a data block including the areas of coded data in a sequence and additional information related to the coded data, the data block further including boundary information indicating a position of a boundary in the data block between two of the areas of coded data adjacent each other in the data block; and d) transferring the data block produced by said producing step.

13. An image transfer method comprising the steps of:

a) performing variable length coding of plural regions of image data to produce respective regions of image codes, where the image data resulted from dividing each of plural pictures provided as an image signal;

b) forming a data block including the regions of image codes in a sequence;

c) forming boundary information indicative of a position, in the data block, of a respective boundary between each two of the regions of image codes adjacent each other in the sequence; and d) transferring the data block and the boundary information.

14. An image transfer apparatus comprising:

input means for inputting image data;

dividing means for dividing the image data into data blocks, wherein each data block includes plural pixels;

coding means for variable length coding the image data in each data block separately to produce corresponding coded data;

producing means for producing a sync block including a predetermined amount of the coded data, the sync block including plural regions each including the coded data corresponding to plural ones of the data blocks, the sync block further including boundary information indicating a position, in the sync block, of a respective boundary between each two of the regions adjacent each other; and transfer means for transferring the sync block.

15. An image transfer apparatus according to claim 14, wherein said coding means includes transformation means for subjecting the image data of each image block to an orthogonal transform.

16. An image transfer apparatus according to claim 14, wherein said producing means includes:

first error detection and correction means for forming first error check codes for the coded data and the boundary information;

second error detection and correction means for forming second error check codes for the boundary information alone.

17. An image transfer method comprising the steps of:

inputting image data;

dividing the image data into data blocks, wherein each data block includes plural pixels;

variable length coding the image data in each data block separately to produce corresponding coded data;

producing a sync block including a predetermined amount of the coded data, the sync block including plural regions each including the coded data corresponding to plural ones of the data blocks, the sync block further including boundary information indicating a position, in the sync block, of a respective boundary between each two of the regions adjacent each other; and transferring the sync block.

\* \* \* \* \*

UNITED STATES PATENT AND TRADEMARK OFFICE
CERTIFICATE OF CORRECTION

PATENT NO. : 5,805,302

DATED : September 8, 1998

INVENTOR(S) : MASAHIKO ENARI ET AL.　　　　　　Page 1 of 2

It is certified that error appears in the above-identified patent and that said Letters Patent is hereby corrected as shown below:

On the title page,:

Item [56] insert "FOREIGN PATENT DOCUMENTS
2127872 5/16/90 Japan
2159186 6/19/90 Japan" and
"OTHER DOCUMENTS
Signal Proc. Image Comm., vol. 1, no. 2, Oct. 1989,
   pp. 153-180, Gilge et al. "Coding of Arbitrarily
   Shaped Image Segments etc."
IEE Proc. vol. 137, no. 5, Sept. 1990. pp. 337-342,
   Frost et al., "Real-time video data compression
   system."
Microprocessing and Microprogramming Proc.
   Euromicro 90, vol. 30, no. 1/5, Aug. 1990,
   pp. 439-445, de Sa et al. "A Parallel
   Architecture etc."
Winter Simulation Conf. Proc., Dec. 1989,
   pp. 1065-1075, Godfrey et al., "Class Simulations
   of Real Time, Compressed Video Transmission etc."
Journal of the Institute of Television Engineers of
   Japan, vol. 44, no. 2, Feb. 1990."

COLUMN 2

Line 39, "$2^5$" should read --$2^8$--.

UNITED STATES PATENT AND TRADEMARK OFFICE
CERTIFICATE OF CORRECTION

PATENT NO. : 5,805,302
DATED : September 8, 1998
INVENTOR(S) : MASAHIKO ENARI ET AL.

It is certified that error appears in the above-identified patent and that said Letters Patent is hereby corrected as shown below:

COLUMN 7

Line 1, "10x30 43,718,400" should read
        --10x30 = 43,718,400--.

COLUMN 13

Line 64, "subjecting.  ,"  should read --subjecting,--.

COLUMN 15

Line 10, "information;" should read --information; and--.

Signed and Sealed this

Twenty-ninth Day of June, 1999

Attest:

Q. TODD DICKINSON

*Attesting Officer*     Acting Commissioner of Patents and Trademarks